(12) United States Patent
Hsieh et al.

(10) Patent No.: US 7,541,273 B2
(45) Date of Patent: Jun. 2, 2009

(54) METHOD FOR FORMING BUMPS

(75) Inventors: Chueh-An Hsieh, Kao-Hsiung (TW);
Li-Cheng Tai, Kao-Hsiung Hsien (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 428 days.

(21) Appl. No.: 11/550,399

(22) Filed: Oct. 17, 2006

(65) Prior Publication Data

US 2007/0087548 A1  Apr. 19, 2007

(30) Foreign Application Priority Data

Oct. 19, 2005   (TW) .............................. 94136546 A (51) Int. Cl.
*H01L 21/44* (2006.01)
(52) U.S. Cl. ................. 438/613; 257/E21.508

(58) Field of Classification Search ................. 438/613
See application file for complete search history.

(56) References Cited

U.S. PATENT DOCUMENTS

| 5,462,638 A | 10/1995 | Datta et al. |
| 6,767,818 B1 * | 7/2004 | Chang et al. ................ 438/613 |
| 2004/0259345 A1 * | 12/2004 | Yu et al. ..................... 438/613 |

* cited by examiner

*Primary Examiner*—David A Zarneke
(74) *Attorney, Agent, or Firm*—Winston Hsu (57) ABSTRACT

A method for forming bumps is disclosed. First, a substrate having a surface and an under bump metallurgy layer formed thereon is provided, and a portion of the under bump metallurgy layer is removed thereafter. Next, a mask having a metal layer thereon is disposed over the surface of substrate, in which the mask includes at least one opening for exposing the under bump metallurgy layer. Subsequently, a metal is disposed in the opening and the mask having the metal layer is removed.

12 Claims, 14 Drawing Sheets

METHOD FOR FORMING BUMPS

BACKGROUND OF THE INVENTION

1. Field of the Invention

The invention relates to a method for forming bumps.

2. Description of the Prior Art

Flip-chip packaging processes are one of the most popular electronic packaging processes utilized today. In contrast to the some other packaging processes, the dies utilized in flip-chip packaging are not electrically connected to a packaging substrate via a bonding pad through a wire bonding process. Instead, the dies are inverted and solder bumps are utilized to electrically connect and mount the dies onto the packaging substrate. Ideally, flip-chip packaging processes are able to significantly reduce the size of package structures and increase the circuit transmission between the dies and the packaging substrate because no extra wires are required for establishing a connection.

Figure 1:
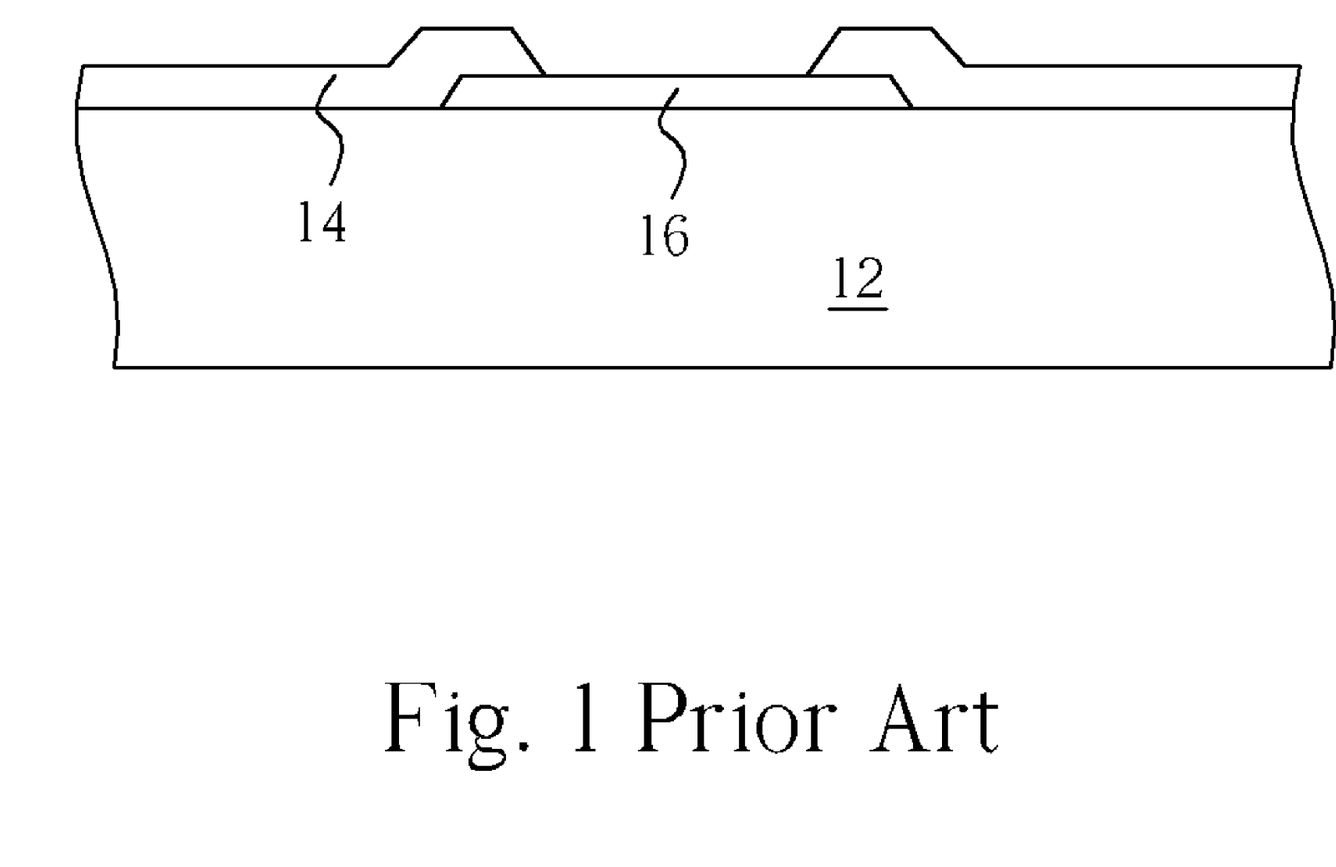
FIG. 1 through FIG. 6 are perspective diagrams showing a method for fabricating bumps according to the prior art.

Please refer to FIG. 1 through FIG. 6. FIG. 1 through FIG. 6 are perspective diagrams showing a method for fabricating a bump 10 according to the prior art. As shown in FIG. 1, a substrate 12, such as a wafer having completed internal devices and wirings, is provided. Next, a patterned passivation layer 14 is disposed on the surface of the substrate 12 to expose a plurality of bonding pads 16. Preferably, the bonding pads 16 are composed of copper or aluminum and utilized to electrically connect the internal wires (not shown) within the substrate 12 and the external wires (not shown) located above the packaging substrate.

Figure 2:
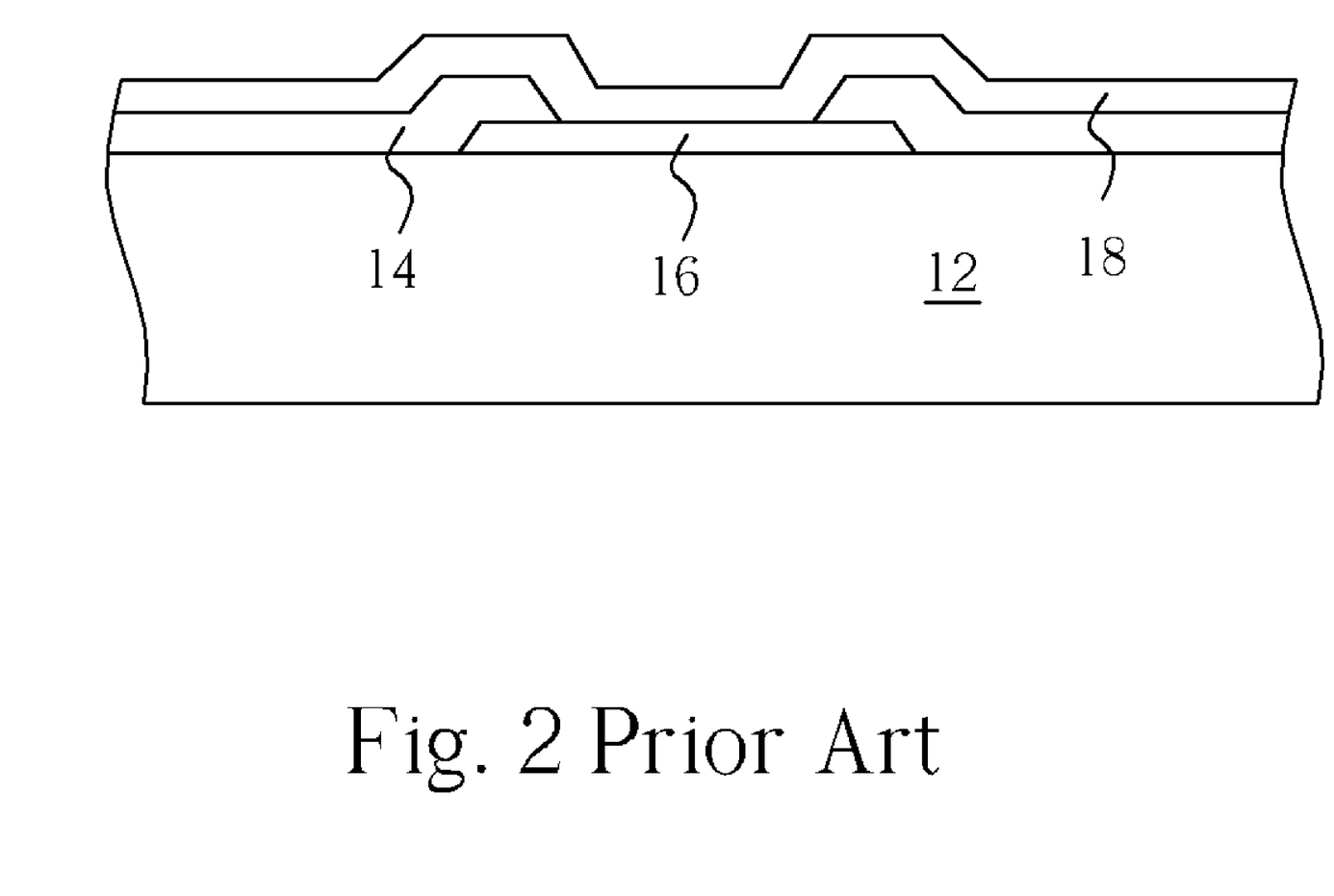
Figure 3:
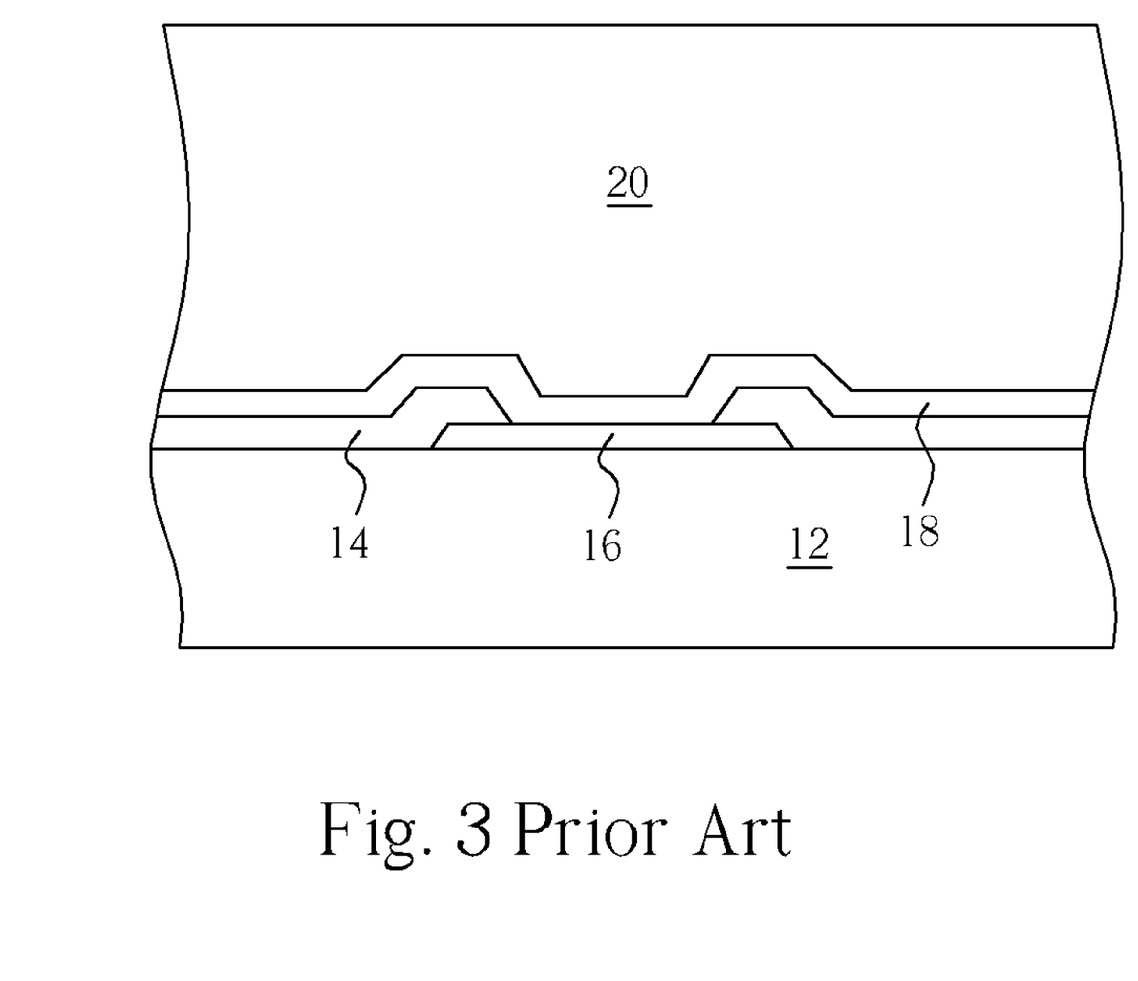

Next, as shown in FIG. 2, a series of sputtering, deposition, and etching process are performed to form an under bump metallurgy layer 18 on each of the bonding pads 16 and the passivation layer 14. The under bump metallurgy layer 18 is composed of aluminum, nickel vanadium, and copper or titanium, nickel vanadium, and copper. As shown in FIG. 3, a photoresist 20 is formed on the substrate 12 and covering the passivation layer 14. Preferably, the photoresist 20 is composed of a dry film photoresist or a liquid type photoresist.

Figure 4:
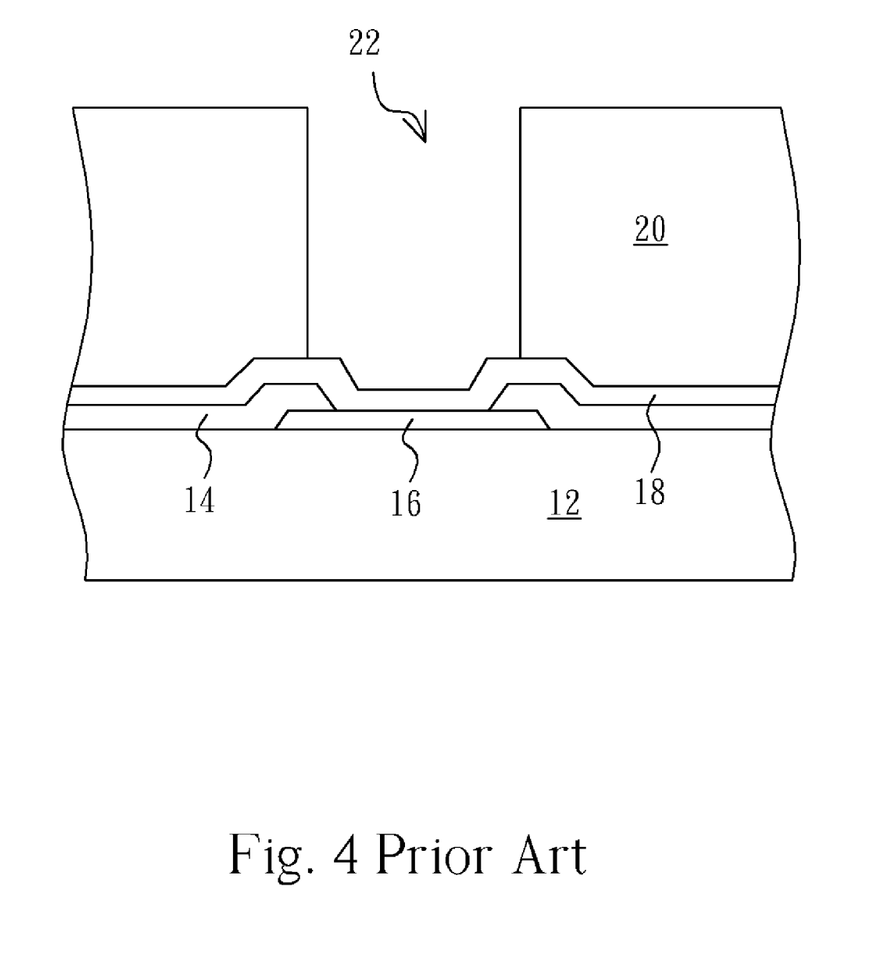

As shown in FIG. 4, an exposure process and a development process are performed to pattern the photoresist 20 and form a plurality of openings 22 within the photoresist 20, in which the openings 22 expose the under bump metallurgy layer 18 above each of the bonding pads 16. An electroplating process is performed thereafter to deposit a solder 24 composed of copper into each of the openings 22.

Figure 5:
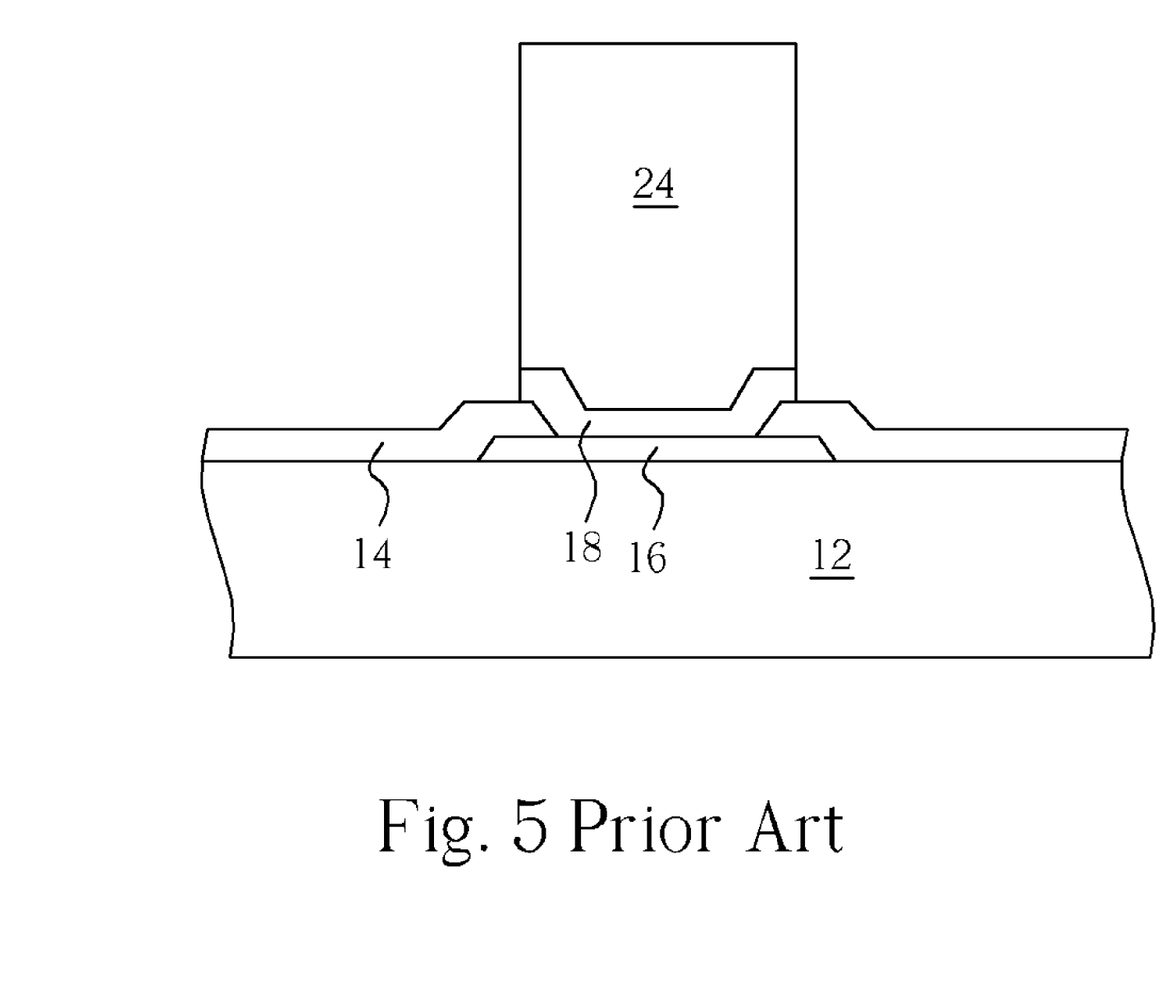
Figure 6:
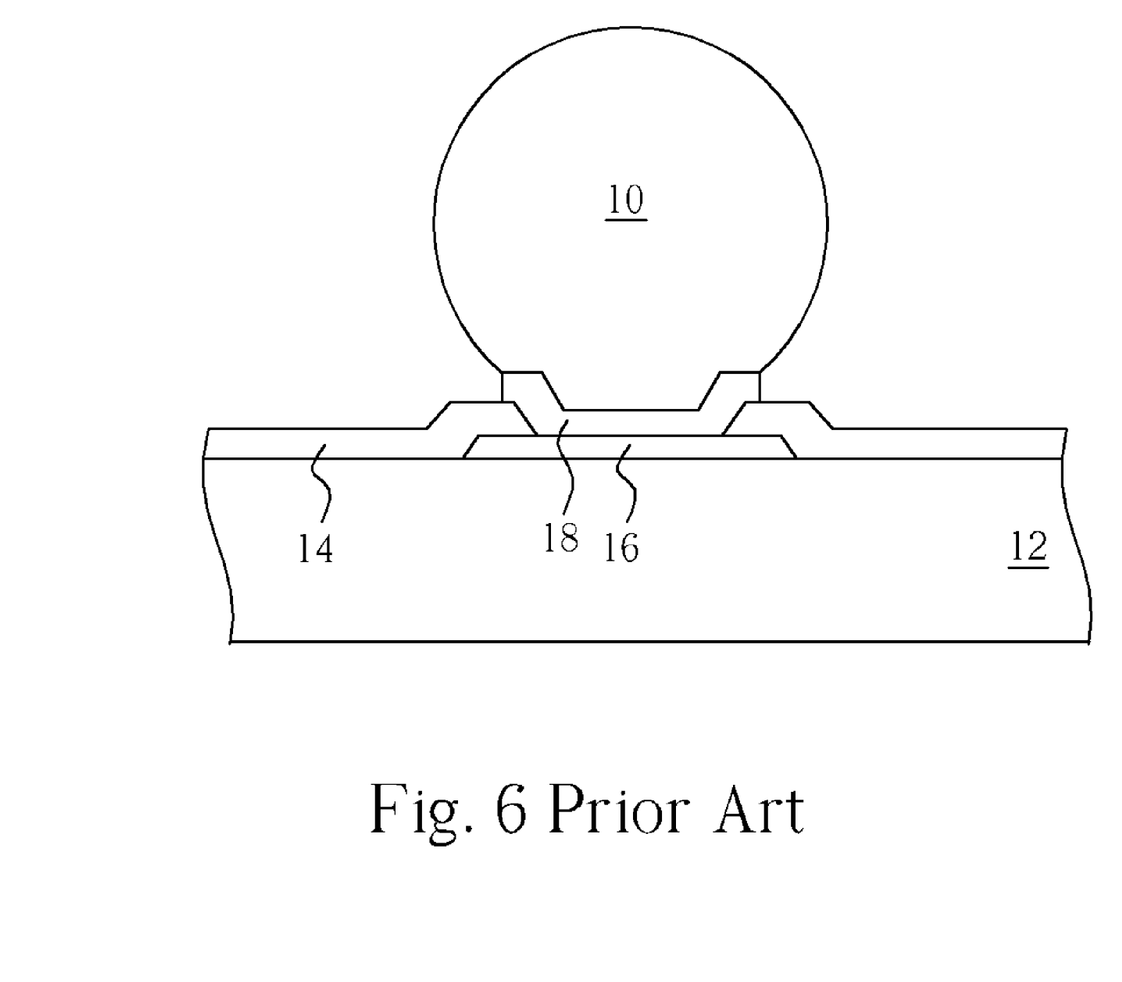

After stripping the photoresist 20, as shown in FIG. 5, an etching process is performed by using the solder 24 as a mask with an etchant composed of nitric acid, acetic acid, phosphoric acid, hydrogen peroxide, hydrochloric acid, and sulfuric acid to remove a portion of the under bump metallurgy layer 18 disposed on the passivation layer 14. Next, as shown in FIG. 6, a reflow process is performed to form a plurality of bumps 10 on the bonding pads 16.

However, the solder 24, being composed of copper, is often corroded by the etchant used for etching the under bump metallurgy layer 18, thus resulting in a state vulnerable for oxidation. The affected solder 24 not only shows a poor electrical performance, but also causes a composition shift for the bumps 10 formed afterwards. The composition shift of the bumps 10 ultimately influences the yield and reliability of other devices connecting to the bumps.

SUMMARY OF THE INVENTION

It is an objective of the present invention to provide a method for forming bumps for solving the aforementioned problems.

According to the present invention, a method for forming bumps is disclosed. First, a substrate having an under bump metallurgy layer formed thereon is provided, and a portion of the under bump metallurgy layer is removed thereafter. Next, a mask having a metal layer thereon is disposed over the surface of substrate, in which the mask includes at least one opening for exposing the under bump metallurgy layer. Subsequently, a metal is disposed in the opening and the mask having the metal layer is removed.

The present invention first uses a patterned photoresist to remove a portion of the under bump metallurgy layer from the surface of the substrate, disposes a mask having a metal layer thereon on the surface of the substrate, and disposes a solder into an opening of the mask. By using the above method, the present invention eliminates the need of using an etchant to remove a portion of the under bump metallurgy layer, thus reducing the phenomenon of solder bump oxidation and improving the yield and reliability for connecting to other devices.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
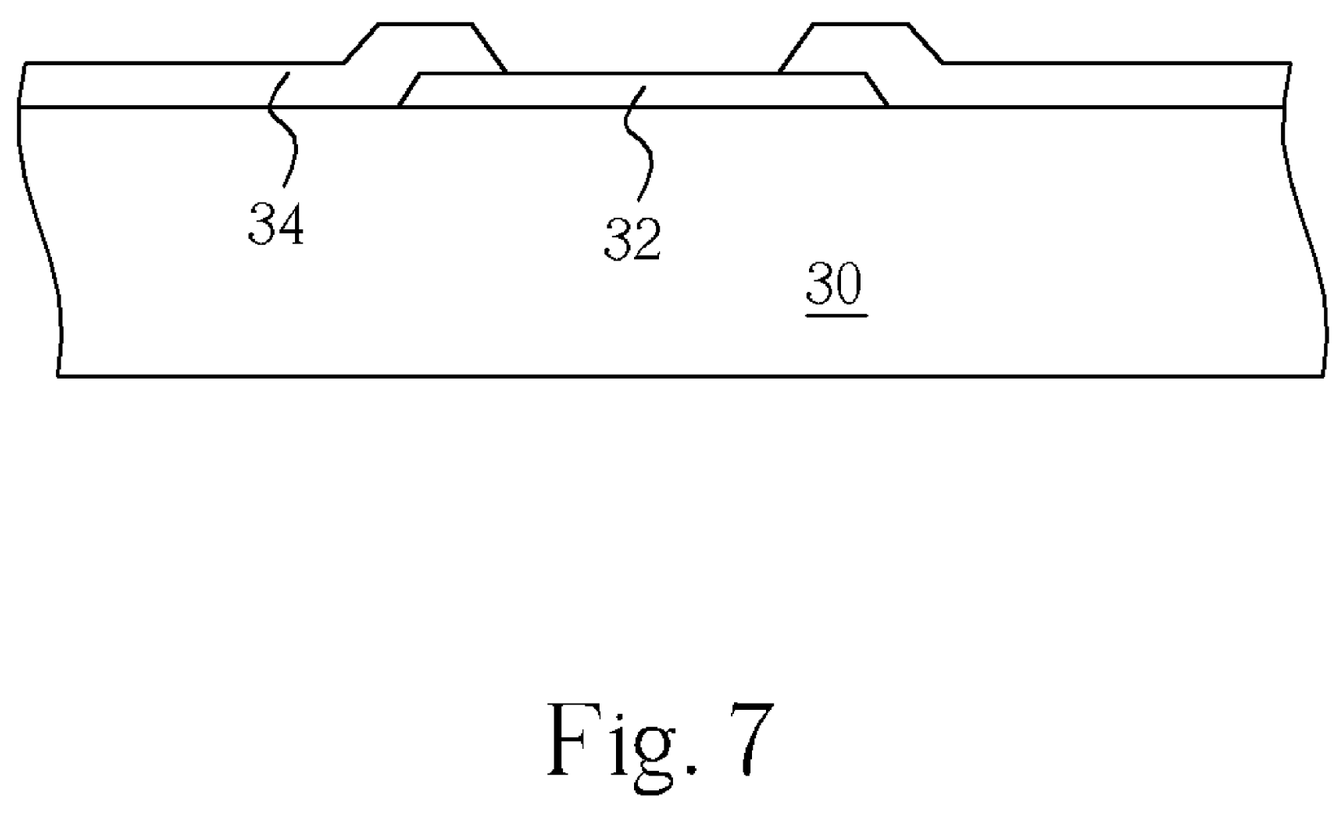
FIG. 7 through FIG. 14 are perspective diagrams showing a method for forming bumps according to a preferred embodiment of the present invention.

Please refer to FIG. 7 through FIG. 14. FIG. 7 through FIG. 14 are perspective diagrams showing a method for forming a bump 48 according to a preferred embodiment of the present invention. As shown in FIG. 7, a substrate 30, such as a wafer having complete interconnection of circuits is provided. The surface of the substrate 30 also includes a plurality of conductive structures, such as a plurality of bonding pads 32. Composed of copper or aluminum, the bonding pad 32 is electrically connected to circuits (not shown) embedded within the substrate 30 and external circuits (not shown) formed on a packaging substrate. Next, a patterned passivation layer 34 is disposed on the substrate 30 and exposes a portion of the bonding pad 32. The patterned passivation layer 34 serves to protect the internal circuits (not shown) of the substrate 30.

Figure 8:
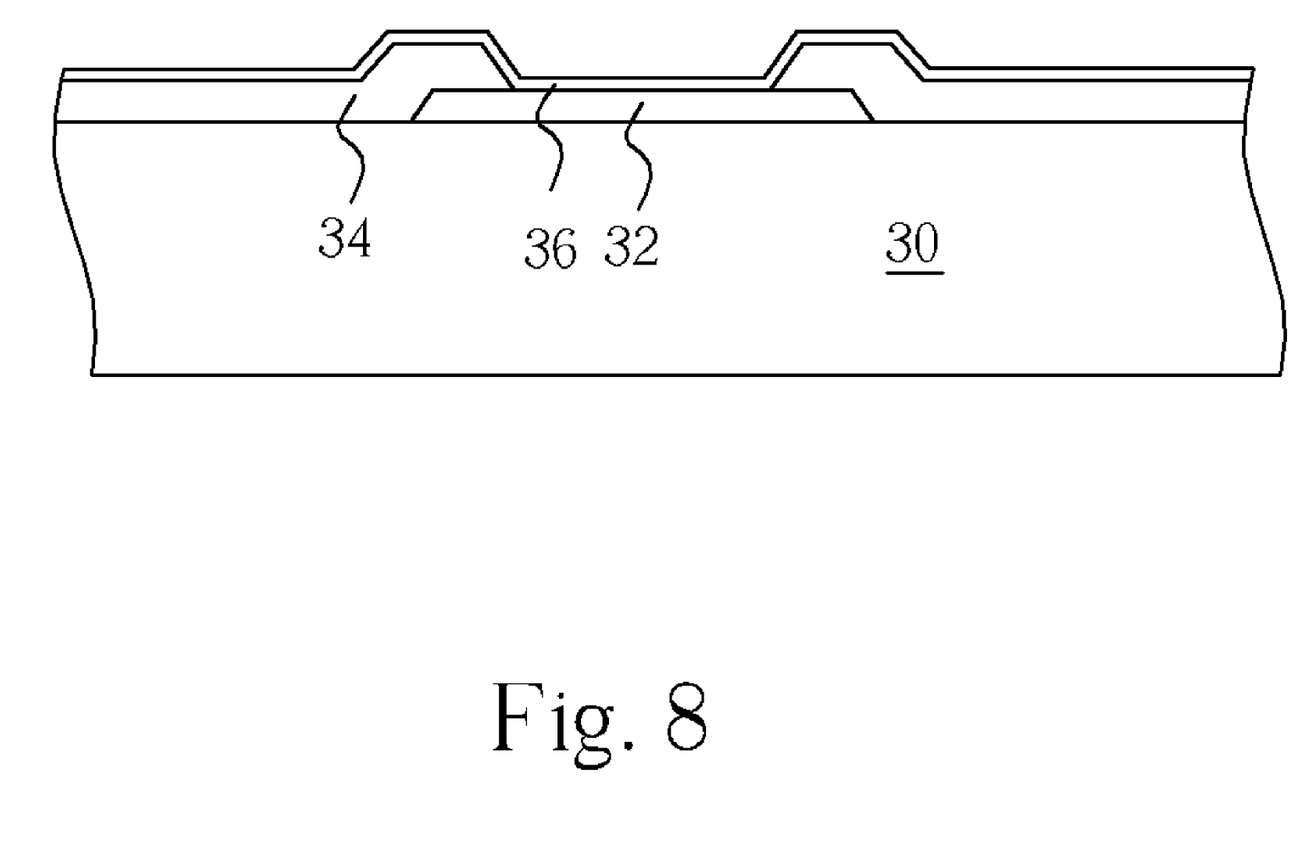

As shown in FIG. 8, a series of sputtering processes, deposition, and etching processes are performed to form an under bump metallurgy layer 36 composed of multiple stacked layers on the exposed bonding pad 32 and the patterned passivation layer 34. Typically, the under bump metallurgy layer 36 is composed of an adhesive layer, a barrier layer, and a wetting layer. The adhesive layer functions to provide adequate adhesiveness for the bonding pad 32 and the patterned passivation layer 34, in which the adhesive layer is selected from the group consisting of aluminum, titanium, chromium, and titanium tungsten. The barrier layer functions to prevent a diffusion phenomenon between the solder ball and the bonding pad, in which the barrier layer is selected from the group consisting of: nickel and nickel vanadium. The wetting layer functions to provide adequate adhesiveness between the under bump metallurgy layer 36 and the solder balls formed afterwards, in which the wetting layer is selected from the group consisting of: copper, molybdenum, and platinum.

Figure 9:
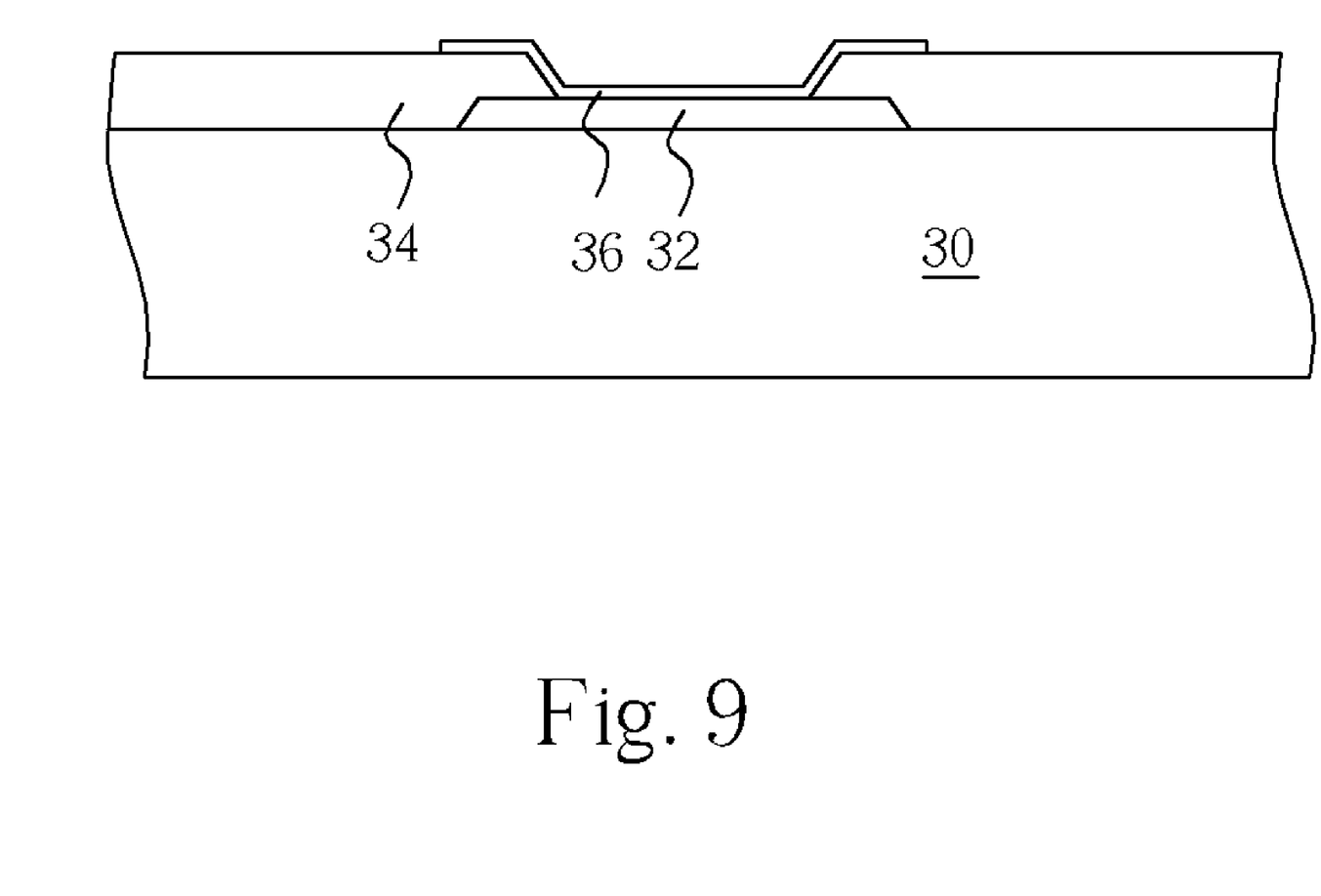

As shown in FIG. 9, a patterned photoresist (not shown) is disposed over the surface of the under bump metallurgy layer 36, in which the patterned photoresist is used as a mask to remove a portion of the under bump metallurgy layer 36, thereby forming an independent under bump metallurgy layer 36 with respect to each bonding pad 32.

Figure 10:
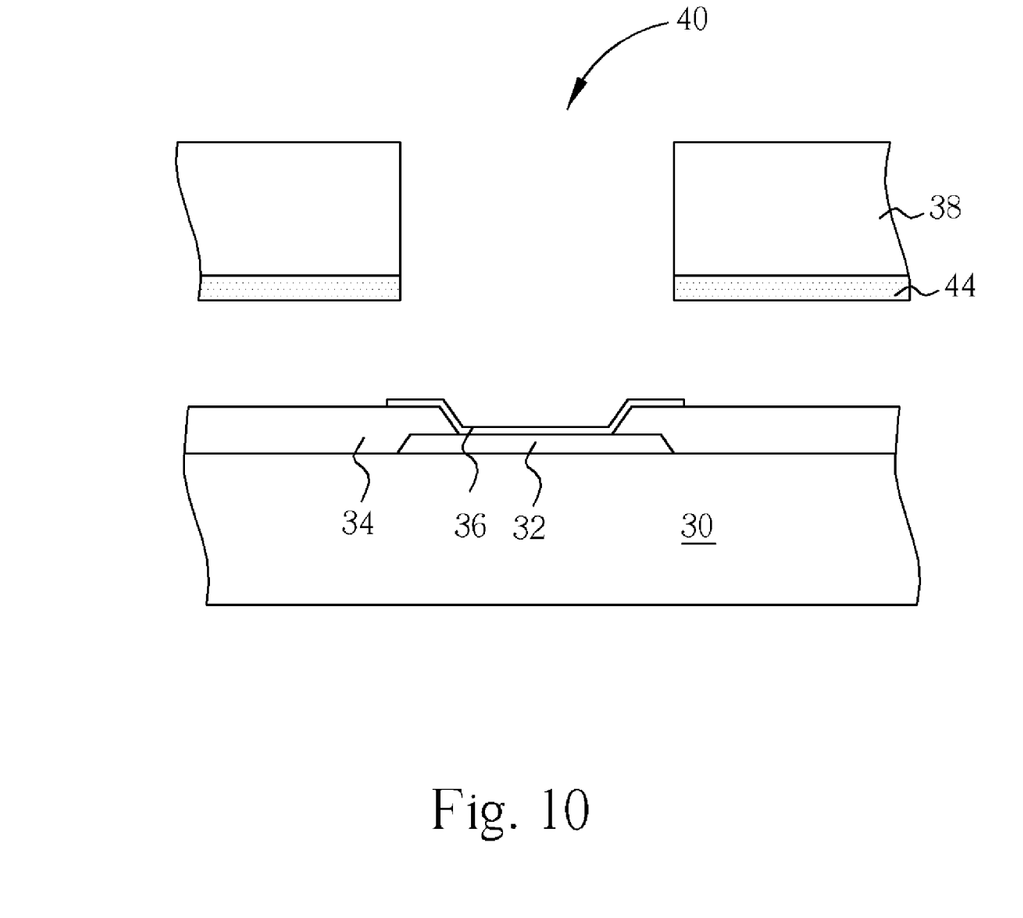

As shown in FIG. 10, a mask 38 having a metal layer 44 attached thereon is disposed on the surface of the substrate 30, in which the mask 38 having attached metal layer 44 includes an opening 40 to expose each under bump metallurgy layer 36. The number of the opening 40 can be adjusted according to the location and number of bumps 48 formed afterwards. Preferably, the mask 28 is composed of non-metal material such as glass, whereas the metal layer 44 is composed of conductive material such as gold, silver, or copper. According to the preferred embodiment of the present invention, the opening 40 is located directly above the bonding pad 32. Alternatively, depending on the design and demand of the fabrication specifications, a redistribution layer (RDL) process can be performed to form the opening 40 adjacent to the bonding pad 32 and above the under bump metallurgy layer 36.

Figure 11:
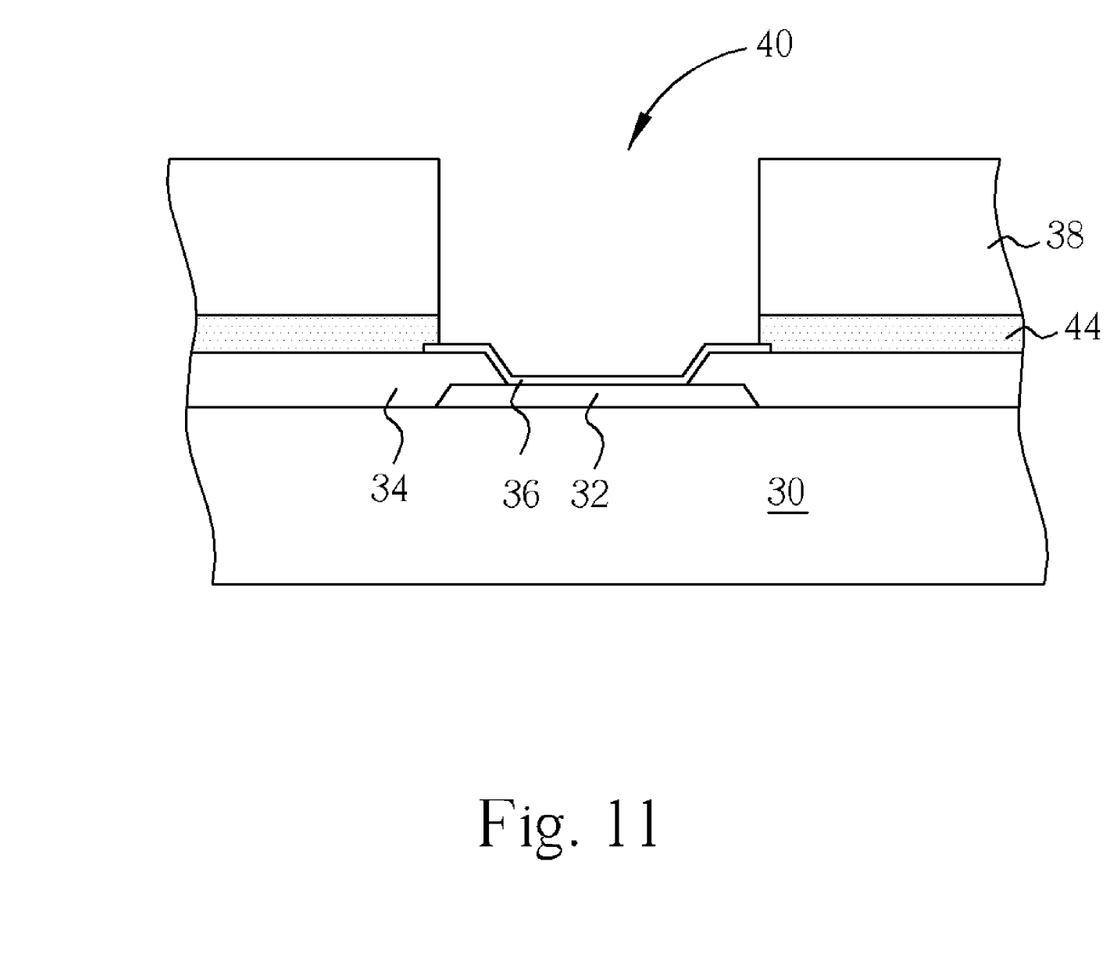
Figure 12:
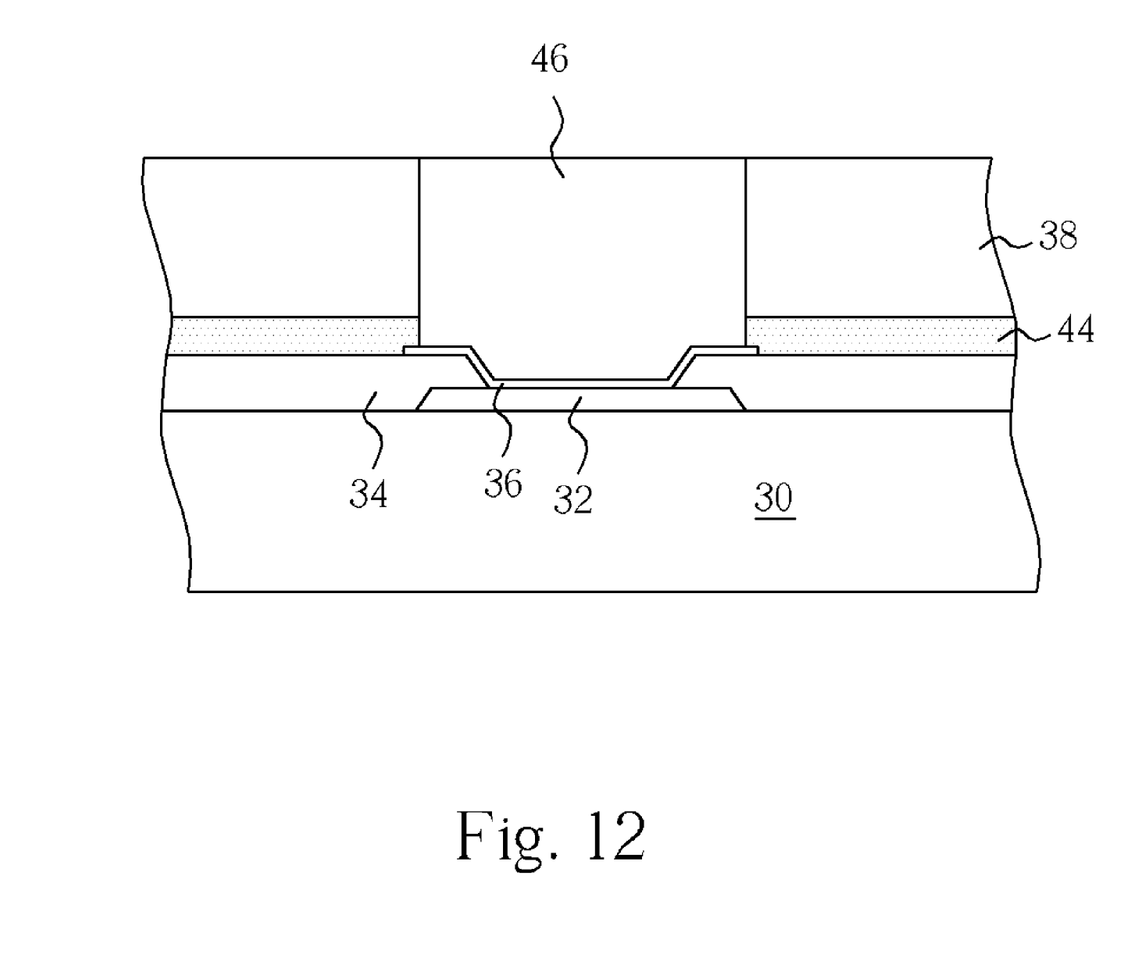

As shown in FIG. 11, the mask 38 having the metal layer 44 thereon is disposed on the surface of the substrate 30. A force is applied thereafter to press the mask 38 against the substrate 30 and establish an electrical connection by contacting the metal layer 44 and a part of the under bump metallurgy layer 36. Next, as shown in FIG. 12, an electroplating process is performed to deposit a solder 46 in the opening 40. Preferably, the solder 46 is composed of tin or copper, and the metal layer 44 is used as an electrode in the electroplating process or processed to form a plating line for the electroplating process.

Figure 13:
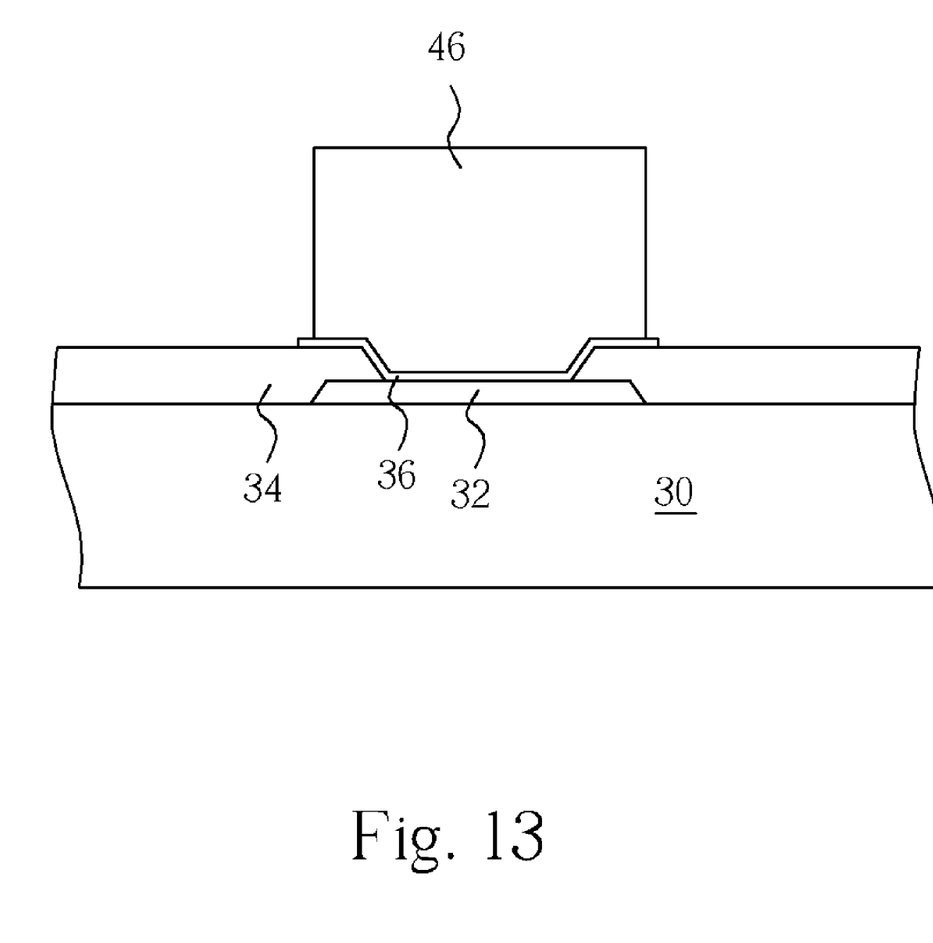
Figure 14:
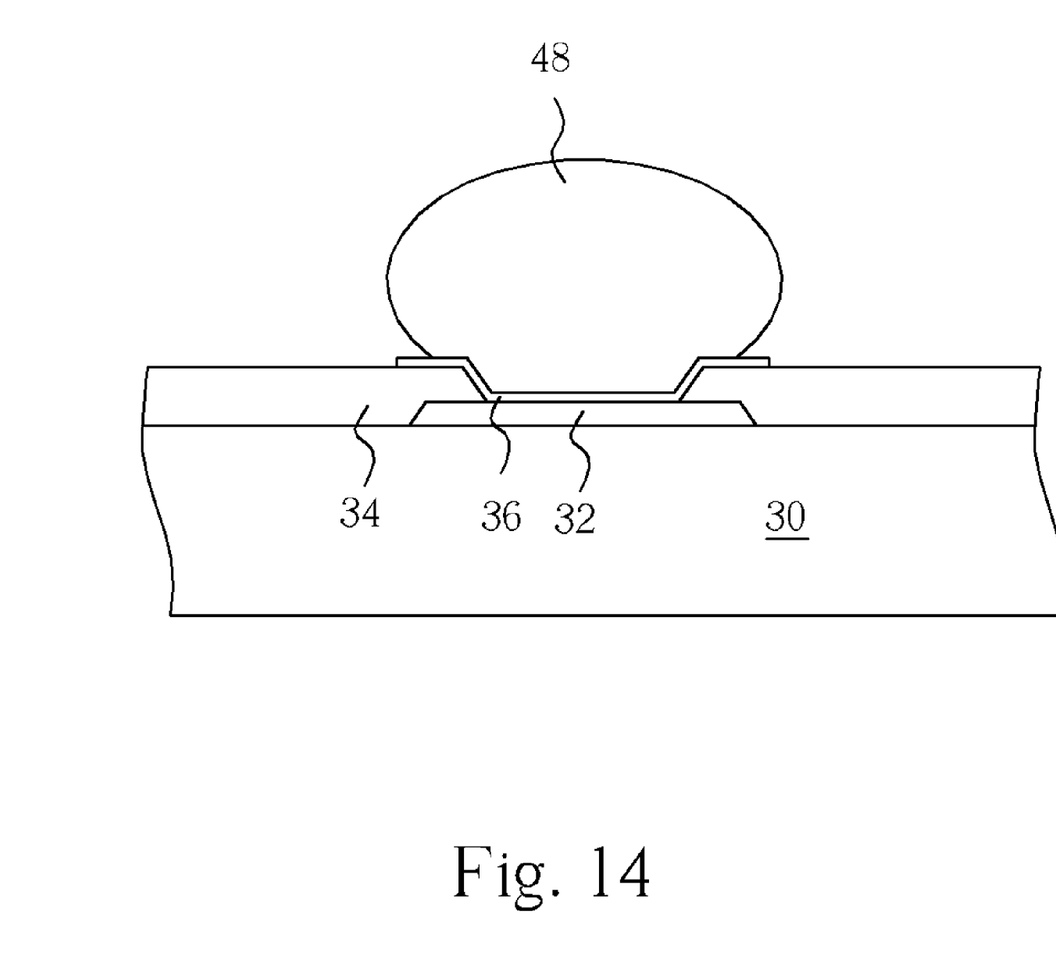

As shown in FIG. 13, a stripping process is performed to remove the mask 38 having the metal layer 44 thereon from the surface of the substrate 30. The removed mask 38 having the metal layer 44 thereon can be reused after being cleansed by a cleaning process. Next, as shown in FIG. 14, a reflow process is performed on the solder 46, such that the solder 46 will expand as a result of surface expansion and form into a bump 48 on the corresponding bonding pad 32.

In contrast to the conventional means of forming bumps, the present invention first uses a patterned photoresist to remove a portion of the under bump metallurgy layer from the surface of the substrate, disposes a mask having a metal layer thereon on the surface of the substrate, and disposes a solder into an opening of the mask. By using the above method, the present invention eliminates the need of using an etchant to remove a portion of the under bump metallurgy layer, thus reducing the phenomenon of solder bump oxidation and improving the yield and reliability for connecting to other devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming bumps, comprising:
   providing a substrate having a surface and an under bump metallurgy layer formed thereon;
   removing a portion of the under bump metallurgy layer;
   disposing a mask having a metal layer over the surface of substrate, wherein the mask comprises at least one opening for exposing the under bump metallurgy layer;
   disposing a metal in the opening; and
   removing the mask having the metal layer.

2. The method for forming bumps of claim 1, wherein the substrate is a wafer.

3. The method for forming bumps of claim 1, wherein the substrate further comprises:
   at least one bonding pad disposed on the surface of the substrate for electrically connecting circuits within the substrate and the under bump metallurgy layer; and
   a patterned passivation layer formed on the substrate, wherein the patterned passivation layer exposes a portion of the bonding pad.

4. The method for forming bumps of claim 3, wherein the opening is formed above the bonding pad.

5. The method for forming bumps of claim 1, wherein the metal comprises copper or solder.

6. The method for forming bumps of claim 1 further comprising performing an electroplating process for forming the metal in the opening.

7. The method for forming bumps of claim 1, wherein the under bump metallurgy layer comprises an adhesion layer, a barrier layer, and a wetting layer.

8. The method for forming bumps of claim 1 further comprising performing a sputtering process for forming the under bump metallurgy layer.

9. The method for forming bumps of claim 1, wherein the metal layer comprises gold, silver, or copper.

10. The method for forming bumps of claim 1 further comprising performing a reflow process after removing the mask having the metal layer.

11. The method for forming bumps of claim 1 further comprising applying a force on the mask after disposing the mask over the surface of the substrate, such that the metal layer of the mask contacts the under bump metallurgy layer for establishing an electrical connection.

12. The method for forming bumps of claim 1 further comprising performing an etching process for removing a portion of the under bump metallurgy layer.

* * * * *